United States Patent
Fujii et al.

(10) Patent No.: US 10,168,394 B2
(45) Date of Patent: Jan. 1, 2019

(54) METHOD FOR MANUFACTURING MAGNETISM MEASUREMENT DEVICE, METHOD FOR MANUFACTURING GAS CELL, MAGNETISM MEASUREMENT DEVICE, AND GAS CELL

(71) Applicant: SEIKO EPSON CORPORATION, Tokyo (JP)

(72) Inventors: Eiichi Fujii, Shiojiri (JP); Kimio Nagasaka, Hokuto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 470 days.

(21) Appl. No.: 14/870,599

(22) Filed: Sep. 30, 2015

(65) Prior Publication Data
US 2016/0097824 A1 Apr. 7, 2016

(30) Foreign Application Priority Data
Oct. 2, 2014 (JP) .................................. 2014-203700

(51) Int. Cl.
G01R 33/032 (2006.01)
G01R 33/00 (2006.01)

(52) U.S. Cl.
CPC ....... G01R 33/032 (2013.01); G01R 33/0052 (2013.01)

(58) Field of Classification Search
None
See application file for complete search history.

(56) References Cited

U.S. PATENT DOCUMENTS

| 4,112,335 | A | * | 9/1978 | Gonser | ............... | A61C 19/004 |
| | | | | | | 315/241 R |
| 5,917,276 | A | | 6/1999 | Traksel et al. | | |
| 6,048,241 | A | | 4/2000 | Traksel et al. | | |
| 6,831,936 | B1 | * | 12/2004 | Smart | ............... | B23K 26/0648 |
| | | | | | | 219/121.61 |

(Continued)

FOREIGN PATENT DOCUMENTS

| JP | H09-185944 A | 7/1997 |
| JP | H10-263873 A | 10/1998 |

(Continued)

OTHER PUBLICATIONS

D. Budker et al. "Resonant Nonlinear Magneto-Optical Effects in Atoms". Reviews of Modern Physics, vol. 74, Oct. 2002, pp. 1153-1201.

*Primary Examiner* — Melissa Koval
*Assistant Examiner* — Courtney McDonnough
(74) *Attorney, Agent, or Firm* — Oliff PLC

(57) ABSTRACT

A method for manufacturing a magnetism measurement device which measures a magnetic field generated from a living body, includes: arranging an ampoule made of borosilicate glass and having a hollow part filled with a solid alkali metal, in a void in a cell section made of quartz glass, and then sealing the cell section; and casting a pulse laser beam on the ampoule through the cell section and thus forming a penetration hole in the ampoule. The pulse laser beam has an energy of 20 µJ/pulse to 200 µJ/pulse. The absorption coefficient of quarts glass for the pulse laser beam is lower than the absorption coefficient of borosilicate glass for the pulse laser beam.

18 Claims, 4 Drawing Sheets

(56) References Cited

U.S. PATENT DOCUMENTS

| | | | |
|---|---|---|---|
| 2005/0236460 A1* | 10/2005 | Abbink | G04F 5/14 |
| | | | 228/101 |
| 2012/0206135 A1 | 8/2012 | Nagasaka et al. | |
| 2012/0318777 A1* | 12/2012 | Kwok | B23K 26/0738 |
| | | | 219/121.75 |
| 2013/0047417 A1* | 2/2013 | Nagasaka | G01R 33/0076 |
| | | | 29/592.1 |
| 2014/0305929 A1* | 10/2014 | Weiss | B41M 5/262 |
| | | | 219/460.1 |

FOREIGN PATENT DOCUMENTS

| | | |
|---|---|---|
| JP | H11-238469 A | 8/1999 |
| JP | 2012-183290 A | 9/2012 |

* cited by examiner

METHOD FOR MANUFACTURING MAGNETISM MEASUREMENT DEVICE, METHOD FOR MANUFACTURING GAS CELL, MAGNETISM MEASUREMENT DEVICE, AND GAS CELL

BACKGROUND

1. Technical Field

The present invention relates to a method for manufacturing a magnetism measurement device, a method for manufacturing a gas cell, a magnetism measurement device, and a gas cell.

2. Related Art

An optical pumping-type magnetism measurement device which casts linearly polarized light on a gas cell with an alkali metal gas enclosed therein and thus measures the magnetic field according to the angle of rotation of the plane of polarization is known. As a method for manufacturing the gas cell in such a magnetism measurement device, JP-A-2012-183290 discloses a method including accommodating an ampoule with an alkali metal enclosed therein in a glass cell, casting a laser beam on the ampoule to break the ampoule (form a penetration hole in the ampoule), and filling the cell with a vapor (gas) of the gasified alkali metal.

The casting of the laser beam on the ampoule accommodated in the cell is carried out through the cell. At this time, any damage to the cell due to the laser beam must be avoided while the laser beam breaks the ampoule. Also, melting of the glass material of the ampoule must be avoided because the melting of the glass material of the ampoule generates an unwanted gas, leading to deterioration in the capabilities of the gas cell. However, in the description of the method for manufacturing the gas cell in JP-A-2012-183290, though the glass material of the cell is disclosed, the glass material of the ampoule is not disclosed and the irradiation conditions of the laser beam or the like are not disclosed, either. Thus, a gas cell and a magnetism measurement device with excellent capabilities that can be stably manufactured by processing an ampoule without damaging the cell and without melting the glass material of the ampoule, and methods for manufacturing the gas cell and the magnetism measurement device, are demanded.

SUMMARY

An advantage of some aspects of the invention is to solve at least a part of the problems described above, and the invention can be implemented as the following forms or application examples.

APPLICATION EXAMPLE 1

This application example is directed to a method for manufacturing a magnetism measurement device which measures a magnetic field generated from a living body, including: arranging, in a void in a cell section made of a first glass material, an ampoule made of a second glass material different from the first glass material and having a hollow part filled with a material, and then sealing the cell section; and casting pulse light on the ampoule through the cell section and thus forming a penetration hole in the ampoule. The pulse light has an energy of 20 µJ/pulse to 200 µJ/pulse.

With the manufacturing method according to this application example, an ampoule made of a second glass material and having a hollow part filled with a material is arranged in a void in a cell section made of a first glass material, and pulse light is cast on the ampoule through the cell section, thus forming a penetration hole. Thus, the material filling the hollow part of the ampoule is gasified and flows out to fill the void in the cell section. Therefore, a gas cell of a magnetism measurement device can be produced. Here, since the cell section and the ampoule are made of different glass materials from each other, the ampoule can be selectively processed without damaging the cell section if pulse light that is transmitted through the cell section (first glass material) and absorbed by the ampoule (second glass material) is used. Also, using pulse light with an energy of 20 µJ/pulse to 200 µJ/pulse, a penetration hole can be formed securely in the ampoule while avoiding the melting of the ampoule. Consequently, a gas cell and a magnetism measurement device having excellent capabilities can be produced stably.

APPLICATION EXAMPLE 2

In the method for manufacturing the magnetism measurement device according to the application example, it is preferable that the first glass has a lower absorption coefficient for the pulse light than an absorption coefficient of the second glass for the pulse light.

With the manufacturing method according to this application example, since the first glass material has a lower absorption coefficient for the pulse light cast thereon than the second glass material, the pulse light is transmitted through the cell section (first glass material) and absorbed by the ampoule (second glass material). Thus, the ampoule can be selectively processed without damaging the cell section.

APPLICATION EXAMPLE 3

In the method for manufacturing the magnetism measurement device according to the application example, it is preferable that the pulse light is a laser beam.

With the manufacturing method according to this application example, since a laser beam has excellent directionality and convergence, a penetration hole can be formed in the ampoule by casting a laser beam on the ampoule.

APPLICATION EXAMPLE 4

In the method for manufacturing the magnetism measurement device according to the application example, it is preferable that the pulse light is ultraviolet light.

With the manufacturing method according to this application example, since ultraviolet light is cast as the pulse light, the pulse light is transmitted through the cell section (first glass material) and absorbed by the ampoule (second glass material) if the first glass material has a low absorption coefficient for the ultraviolet light and the second glass material has a high absorption coefficient for the ultraviolet light.

APPLICATION EXAMPLE 5

In the method for manufacturing the magnetism measurement device according to the application example, it is preferable that the pulse light has a wavelength range of 248 nm to 355 nm.

With the manufacturing method according to this application example, since the wavelength range of the pulse light is 248 nm to 355 nm, the pulse light of ultraviolet light can be cast.

APPLICATION EXAMPLE 6

In the method for manufacturing the magnetism measurement device according to the application example, it is preferable that the pulse light has a pulse width of nanoseconds.

With the manufacturing method according to this application example, since the pulse width of the pulse light is on the order of nanoseconds, the ampoule can be processed in a stable state.

APPLICATION EXAMPLE 7

In the method for manufacturing the magnetism measurement device according to the application example, it is preferable that the pulse width of pulse light is 10 nanoseconds to 50 nanoseconds.

With the manufacturing method according to this application example, since the pulse width of the pulse light is 10 nanoseconds to 50 nanoseconds, the ampoule can be processed in a stable state where the influence of heat is restrained.

APPLICATION EXAMPLE 8

In the method for manufacturing the magnetism measurement device according to the application example, it is preferable that the material is an alkali metal.

With the manufacturing method according to this application example, since the hollow part of the ampoule is filled with an alkali metal, forming a penetration hole in the ampoule enables a gas of the alkali metal to flow out of the hollow part and fill the void in the cell section.

APPLICATION EXAMPLE 9

This application example is directed to a method for manufacturing a gas cell including: arranging, in a void in a cell section made of a first glass material, an ampoule made of a second glass material different from the first glass material and having a hollow part filled with a material, and then sealing the cell section; and casting pulse light on the ampoule through the cell section and thus forming a penetration hole in the ampoule. The pulse light has an energy of 20 µJ/pulse to 200 µJ/pulse.

With the manufacturing method according to this application example, a gas cell having excellent capabilities can be produced.

APPLICATION EXAMPLE 10

This application example is directed to a magnetism measurement device manufactured by the methods for manufacturing the magnetism measurement device according to the application examples.

With the configuration according this application example, a magnetism measurement device having excellent capabilities can be provided.

APPLICATION EXAMPLE 11

This application example is directed to a gas cell manufactured by the method for manufacturing the gas cell according to the application example.

With the configuration according to this application example, a gas cell having excellent capabilities can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
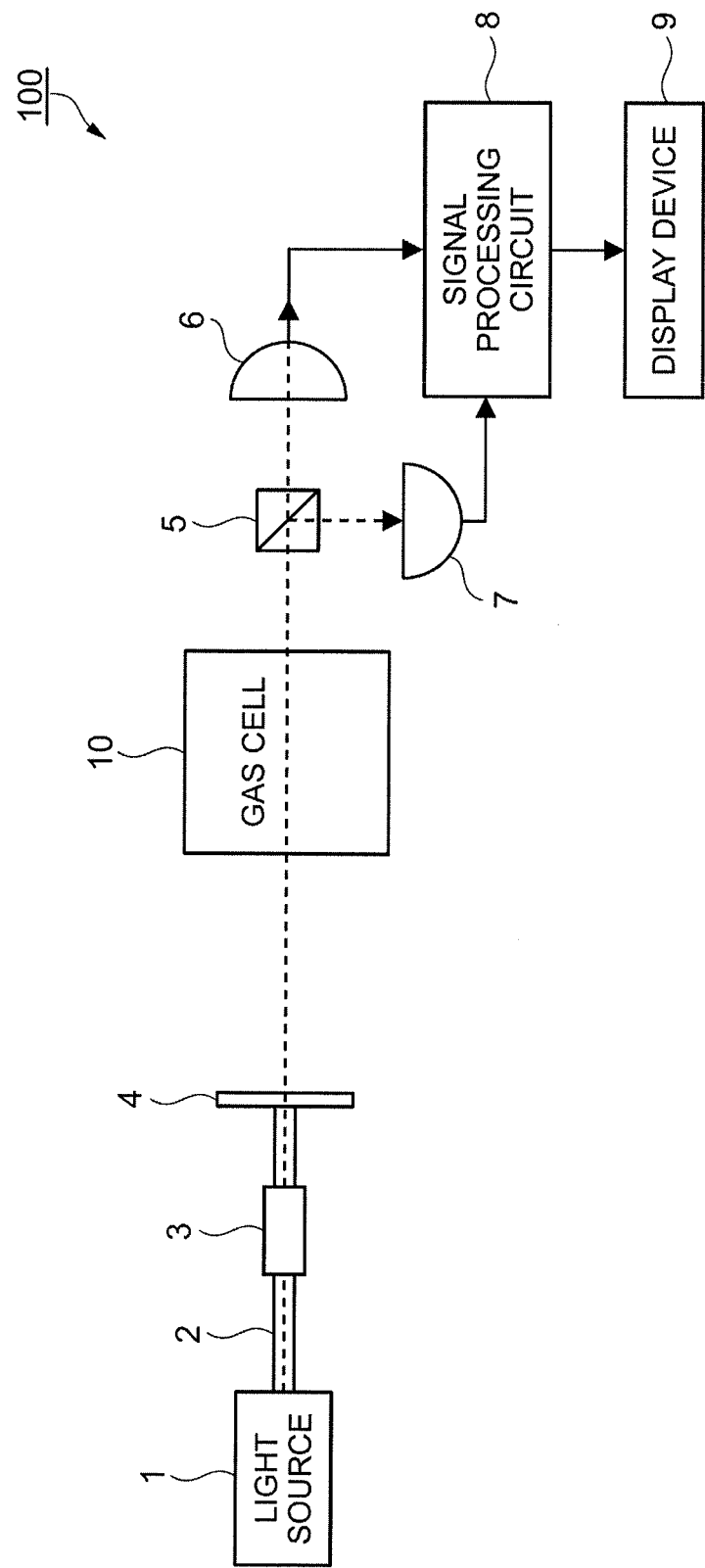
FIG. 1 is a block diagram showing the configuration of a magnetism measurement device according to an embodiment.

Hereinafter, a specific embodiment of the invention will be described with reference to the drawings. In the drawings used, parts to be explained are shown as enlarged, reduced, or exaggerated according to need, so that these parts are recognizable. Components other than those necessary for explanation may be omitted from the illustrations.

Configuration of Magnetism Measurement Device

The configuration of a magnetism measurement device according to this embodiment will be described with reference to FIG. 1. FIG. 1 is a block diagram showing the configuration of the magnetism measurement device according to the embodiment. A magnetism measurement device 100 according to the embodiment is a magnetism measurement device using nonlinear magneto-optical rotation (NMOR). The magnetism measurement device 100 is used, for example, for a biological state measurement device (magnetocardiograph or magnetoencephalograph, or the like) which measures a micro magnetic field generated from a living body such as a magnetic field from the heart (cardiac magnetic field) or a magnetic field from the brain (cerebral magnetic field).

As shown in FIG. 1, the magnetism measurement device 100 has a light source 1, an optical fiber 2, a connector 3, a polarizer 4, a gas cell 10, a polarizing beam splitting unit 5, a photodetector (PD) 6, a photodetector 7, a signal processing circuit 8, and a display device 9. In the gas cell 10, an alkali metal gas (alkali metal atoms in a gaseous state) is enclosed. The alkali metal can be, for example, cesium (Cs), rubidium (Rb), potassium (K), sodium (Na), or the like. In the description below, the case of using cesium as the alkali metal is employed as an example.

The light source 1 is a device which outputs a laser beam with a wavelength corresponding to the absorption line of cesium (for example, 894 nm equivalent to the D1 line), for example, a tunable laser. The laser beam outputted from the light source 1 is so-called CW (continuous wave) light that continuously has a constant amount of light.

The polarizer 4 is an element which polarizes the laser beam in a specific direction and thus forms linearly polarized light. The optical fiber 2 is a member which guides the laser beam outputted from the light source 1 toward the gas cell 10. As the optical fiber 2, for example, a single-mode optical fiber which propagates only light in the basic mode is used. The connector 3 is a member for connecting the optical fiber 2 to the polarizer 4. The connector 3 screws and thus connects the optical fiber 2 to the polarizer 4.

The gas cell 10 is a box (cell) having a void inside. The alkali metal (in this example, cesium) gas is enclosed in this void. The configuration of the gas cell 10 will be described later.

The polarizing beam splitting unit 5 is an element which splits the incident laser beam into two polarized light component beams orthogonal to each other. The polarizing beam splitting unit 5 is, for example, a Wollaston prism or polarizing beam splitter. The photodetector 6 and the photodetector 7 are detectors sensitive to the wavelength of the laser beam, and output a current corresponding to the amount of light of the incident light to the signal processing circuit 8. It is desirable that the photodetector 6 and the photodetector 7 are made of a non-magnetic material because the measurement by these photodetectors can be affected if the photodetectors themselves generate a magnetic field. The photodetector 6 and the photodetector 7 are arranged on the same side as the polarizing beam splitting unit 5 (downstream), as viewed from the gas cell 10.

To describe the arrangement of each part of the magnetism measurement device 100 along the path of the laser beam, the light source 1 is situated most upstream in the path of the laser beam, and the optical fiber 2, the connector 3, the polarizer 4, the gas cell 10, the polarizing beam splitting unit 5, and the photodetectors 6, 7 are arranged in this order from the upstream side.

The operation of each part of the magnetism measurement device 100 will be described along the traveling of the laser beam. The laser beam outputted from the light source 1 is guided by the optical fiber 2 and reaches the polarizer 4. The laser beam reaching the polarizer 4 turns into linearly polarized light with a higher degree of polarization. The laser beam, while being transmitted through the gas cell 10, excites (optically pumps) the alkali metal atoms enclosed in the gas cell 10. At this point, the plane of polarization rotates in response to a polarization plane rotation effect corresponding to the intensity of the magnetic field. The laser beam, after being transmitted through the gas cell 10, is split into two polarized light component beams by the polarizing beam splitting unit 5. The amounts of light of the two polarized light component beams are measured (probed) by the photodetector 6 and the photodetector 7.

The signal processing circuit 8 receives signals indicating the amounts of light of the beams measured by the photodetector 6 and the photodetector 7, respectively. On the basis of each of the received signals, the signal processing circuit 8 measures the angle of rotation of the plane of polarization of the laser beam. The angle of rotation of the plane of polarization is expressed by a function based on the intensity of the magnetic field in the direction of propagation of the laser beam (see, for example, D. Budker and five others, "Resonant nonlinear magneto-optical effects in atoms," Review of Modern Physics, American Physical Society, U.S.A., October 2002, Volume 74, Issue 4, p. 1153-1201, Equation (2). While the Equation (2) relates to linear optical rotation, a substantially similar equation can be used in the case of NMOR as well). The signal processing circuit 8 measures the intensity of the magnetic field in the direction of propagation of the laser beam, on the basis of the rotation angle of the plane of polarization. The display device 9 displays the intensity of the magnetic field measured by the signal processing circuit 8.

Figure 2A:
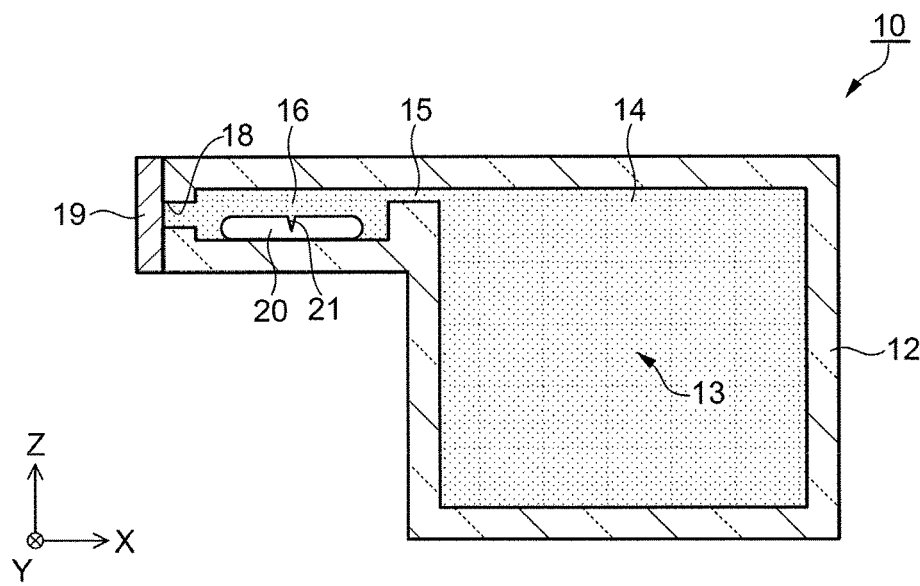
FIGS. 2A to 2C are schematic cross-sectional views showing the configurations of a gas cell and an ampoule according to the embodiment.
Figure 2B:
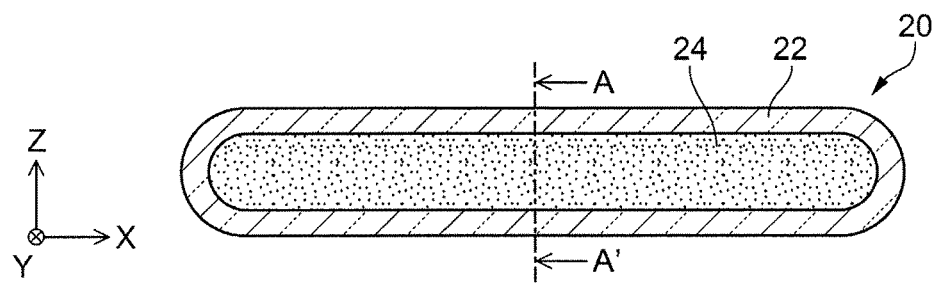
Figure 2C:
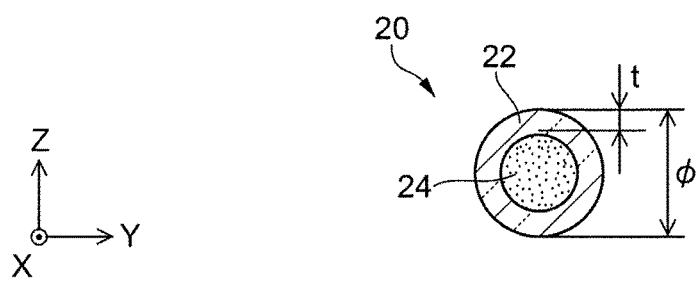

Next, the gas cell and an ampoule used for the gas cell according to the embodiment will be described with reference to FIGS. 2A to 2C. FIGS. 2A to 2C are schematic cross-sectional views showing the configuration of the gas cell and the ampoule according to the embodiment. More specifically, FIG. 2A is a schematic cross-sectional view of the gas cell. FIG. 2B is a schematic cross-sectional view of the ampoule. FIG. 2C is a schematic cross-sectional view taken along A-A' in FIG. 2B.

Configuration of Gas Cell

FIG. 2A shows a schematic cross-sectional view of the gas cell 10 according to this embodiment. In FIG. 2A, the direction of the height of the gas cell 10 is defined as a Z-axis, and the upward direction is a +Z-direction. The direction intersecting with the Z-axis and along the length of the gas cell 10 is defined as an X-axis, and the rightward direction in FIG. 2A is a +X-direction. The direction intersecting with the Z-axis and the X-axis and along the width of the gas cell 10 is defined as a Y-axis, and the direction from the front toward the back as viewed on the face of FIG. 2A is a +Y-direction.

As shown in FIG. 2A, the gas cell 10 according to the embodiment is made up of a cell section 12 and a sealing section 19. The cell section 12 is a box (cell) having a void inside and is formed of quartz glass as a first glass material. The inner wall of the cell section 12 may be coated, for example, with paraffin or the like. The thickness of the cell section 12 is, for example, approximately 1.5 mm. The cell section 12 has a main chamber 14 and a reservoir 16, as the inner void. The main chamber 14 and the reservoir 16 communicate with each other via a communication hole 15. The inner diameter of the communication hole 15 is, for example, approximately 0.4 mm to 1 mm.

In the void inside the cell section 12, an alkali metal gas 13 is enclosed. In the void inside the cell section 12, an inert gas such as a rare gas may exist in addition to the alkali metal gas 13. An ampoule 20 is arranged in the reservoir 16. An opening 18 is provided at the end of the cell section 12 on the side of the reservoir 16. The opening 18 is closed by the sealing section 19, thus sealing the cell section 12. As the material of the sealing section 19, for example, low-melting glass frit is used.

Configuration of Ampoule

FIG. 2B shows an X-Z cross section of the ampoule 20. As shown in FIG. 2B, the ampoule 20 according to the embodiment is made up of a hollow glass tube 22. The glass tube 22 is formed of borosilicate glass as a second glass material.

The glass tube 22 extends along one direction (in FIG. 2B, the X-axis) and has both ends thereof welded. The glass tube 22, which is hollow inside, is thus sealed. The shape of both ends of the glass tube 22 is not limited to the round shape as shown in FIG. 2B and may be almost flat or partly pointed, or the like. The hollow inside of the glass tube 22 is filled with a solid alkali metal 24 (particle or powder alkali metal atoms) 24 as a material. As the solid alkali metal 24, rubidium, potassium, and sodium can be used as well as cesium, as described above.

FIG. 2B shows the state where the ampoule 20 (glass tube 22) is sealed. At the stage where the ampoule 20 is manufactured, the glass tube 22 is sealed. However, at the stage where the gas cell 10 is completed, shown in FIG. 2A, a penetration hole 21 is formed in the glass tube 22, breaking the sealing. Thus, the solid alkali metal 24 in the ampoule 20 evaporates and flows into the gas cell 10, and the void in the cell section 12 is filled with the alkali metal gas 13. To facilitate the evaporation and outflow of the solid alkali metal 24 from inside the ampoule 20, for example, a gap of approximately 1.5 mm is provided between the top surface of the ampoule 20 and the inner surface of the cell section 12.

FIG. 2C shows a Y-Z cross section of the ampoule 20. As shown in FIG. 2C, the Y-Z cross section of the glass tube 22 is, for example, substantially circular, but may be other shapes. The outer diameter φ of the glass tube 22 is 0.2 mm ≤φ≤1.2 mm. The thickness t of the glass tube 22 is 0.1 mm ≤t≤0.5 mm and is preferably about 20% of the outer diameter φ. If the thickness t of the glass tube 22 is less than 0.1 mm, the glass tube 22 will be damaged easily. If the thickness t of the glass tube 22 exceeds 0.5 mm, processing (described in detail later) such as providing the penetration hole 21 in the glass tube 22 will be difficult.

Method for Manufacturing Gas Cell

Figure 3A:
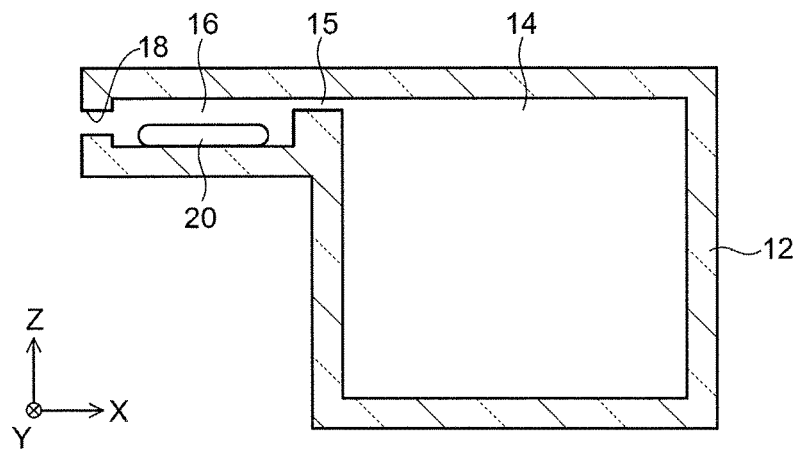
FIGS. 3A to 3C explain a method for manufacturing a gas cell according to the embodiment.
Figure 3B:
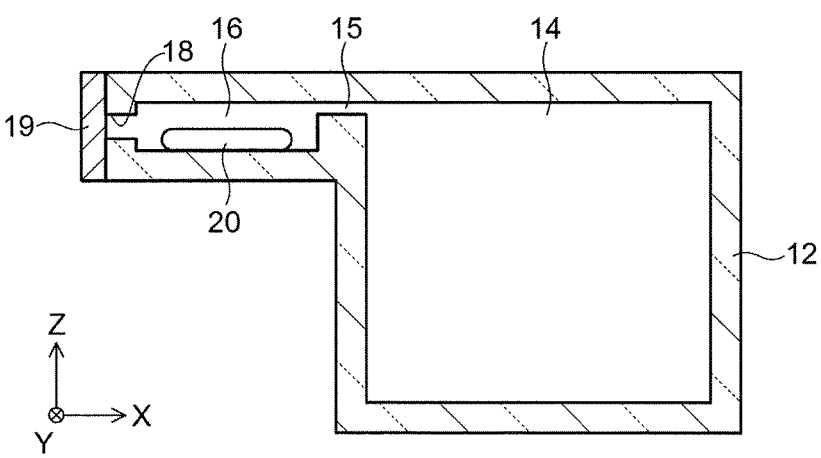
Figure 3C:
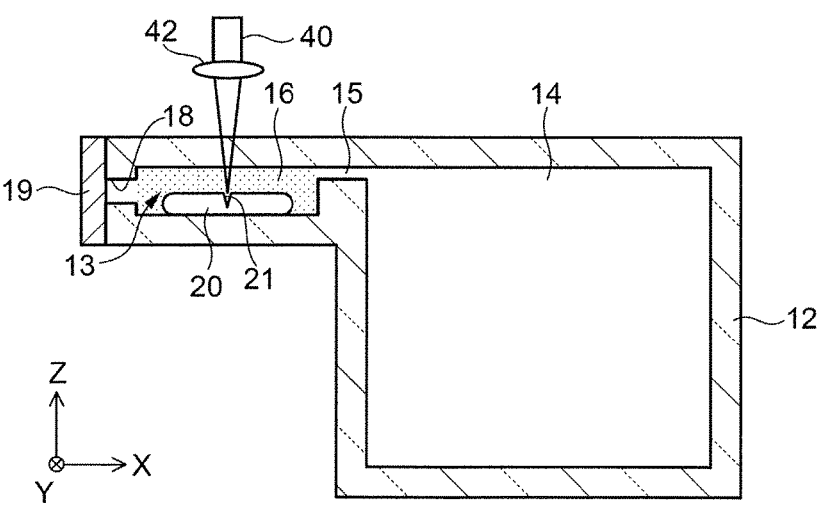

A method for manufacturing the gas cell 10 will be described with reference to FIGS. 3A to 3C. FIGS. 3A to 3C explain the method for manufacturing the gas cell according to the embodiment.

First, the cell section 12 shown in FIG. 3A is prepared. Although not illustrated, for example, a glass plate of quartz glass is cut to prepare glass plate members corresponding to the respective walls of the cell section 12. Then, these glass plate members are assembled and joined together with an adhesive or by welding, thus providing the cell section 12 shown in FIG. 3A. At this stage, the opening 18 of the cell section 12 is opened.

Subsequently, the ampoule 20 is accommodated in the reservoir 16 of the cell section 12. The ampoule 20 is inserted through the opening 18 provided on the side of the reservoir 16 of the cell section 12 and accommodated inside the reservoir 16. At this stage, the ampoule 20 is in the state where the inside of the hollow glass tube 22 is filled with the solid alkali metal 24 and sealed.

The ampoule 20 is formed by filling the hollow part of the tubular glass tube 22 with the solid alkali metal 24 in a low-pressure environment close to a vacuum (ideally, in a vacuum) and welding and sealing both ends of the glass tube 22 (see FIG. 2B). The alkali metal such as cesium used as the solid alkali metal 24 is highly reactive and cannot be handled in the atmosphere. Therefore, the alkali metal in the state of being enclosed in the ampoule 20 in a low-pressure environment is accommodated in the cell section 12.

Next, the inside of the cell section 12 is degassed sufficiently and the cell section 12 is sealed as shown in FIG. 3B in the state where there are very few impurities in the inner void. For example, in a low-pressure environment close to a vacuum (ideally, in a vacuum), the opening 18 of the cell section 12 is closed by the sealing section 19, thus sealing the cell section 12.

Subsequently, a pulse laser beam 40 as pulse light is condensed via a condensing lens 42 and cast on the glass tube 22 of the ampoule 20 (see FIG. 2B) via the cell section 12, as shown in FIG. 3C. Thus, the penetration hole 21 is formed in the glass tube 22, allowing the solid alkali metal 24 (see FIG. 2B) in the ampoule 20 to evaporate and flow out into the void in the gas cell 10. Since a laser beam has excellent directionality and convergence, the penetration hole 21 can be easily formed in the glass tube 22 by casting the pulse laser beam 40.

In the process of forming the penetration hole 21, it is necessary to process only the glass tube 22 of the ampoule 20 (see FIG. 2B) without damaging the cell section 12. If the glass tube 22 melts at the time of forming the penetration hole 21, an unwanted gas is generated, reacts with the solid alkali metal 24, and significantly reduces the capabilities of the gas cell 10. Therefore, it is necessary to form the penetration hole 21 without causing the glass tube 22 of the ampoule 20 to melt. Thus, in the embodiment, the following irradiation conditions for the pulse laser beam 40 are employed.

Figure 4:
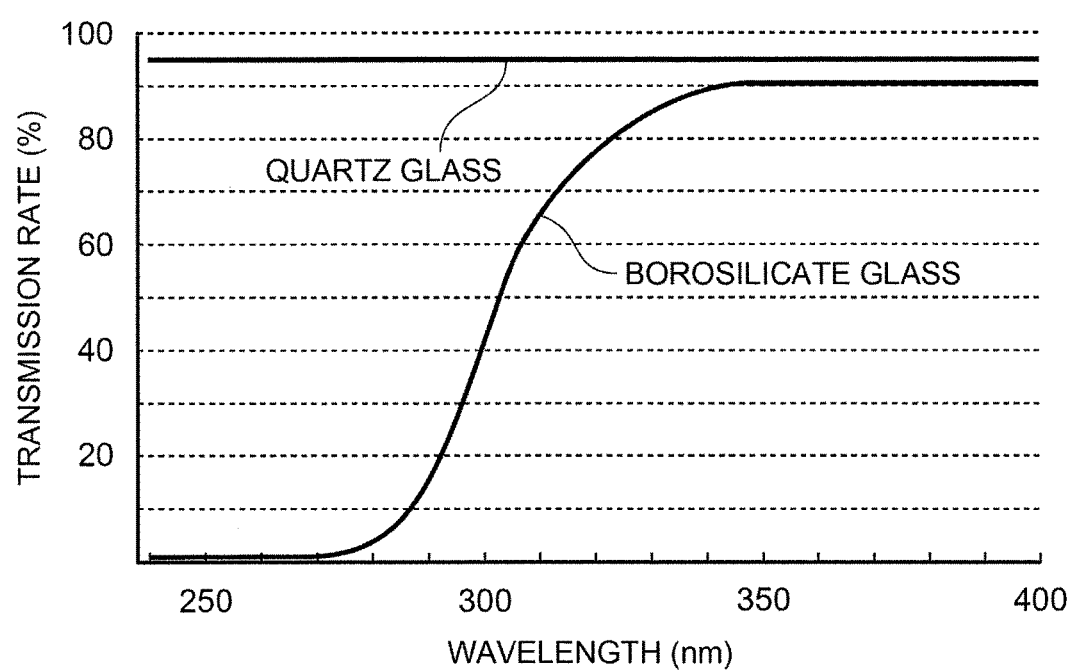
FIG. 4 shows the relations between the wavelength of light and the transmission rates of glass materials, as a comparison.

First, as the pulse laser beam 40, a pulse laser beam in the ultraviolet wavelength range of 248 nm to 355 nm is used. FIG. 4 shows the relations between the wavelength of light and the transmission rates of glass materials, as a comparison. As shown in FIG. 4, the transmission rate of quartz glass is approximately 95% and has almost no change in the light wavelength range of 250 nm to 400 nm. Meanwhile, the transmission rate of borosilicate glass shown in FIG. 4 is approximately 0% up to the light wavelength of 270 nm but increases in the range of 270 nm to 350 nm and reaches approximately 90% at 350 nm and above. The transmission rates shown in FIG. 4 are an example. For example, the transmission rate of borosilicate glass may be different from the example shown in FIG. 4, depending on the mixture ratio of the components of borosilicate glass.

In this way, for the light in the ultraviolet wavelength range (hereinafter referred to as ultraviolet light), the transmission rate of quartz glass is higher than the transmission rate of borosilicate glass. In other words, for ultraviolet light, the absorption coefficient of quartz glass is lower than the absorption coefficient of borosilicate glass. Therefore, the pulse laser beam 40, which is ultraviolet light, is transmitted through quarts glass and absorbed by borosilicate glass. Thus, the glass tube 22 can be selectively processed without damaging the cell section 12.

While a YAG third-harmonic (THG) laser is used as the pulse laser beam 40 in this embodiment, a fourth-harmonic (FHG) laser can also be used. A method such as using the same quartz glass as the cell section 12 as the material of the glass tube 22 of the ampoule 20 and mixing this material with a material having a high absorption coefficient for ultraviolet light (for example, a ceramic, metal or the like), is conceivable. However, in such a case, at the time of casting the pulse laser beam 40 on the glass tube 22 to form the penetration hole 21, the mixed material may generate an unwanted gas, react with the solid alkali metal 24 and significantly reduce the capabilities of the gas cell 10.

Next, the energy of the pulse laser beam 40 is set to 20 µJ/pulse to 200 µJ/pulse. A lower energy of the pulse laser beam 40 results in a shallow depth of processing, making it difficult to penetrate the glass tube 22 and break the sealing. Meanwhile, a higher energy of the pulse laser beam 40 achieves a deep depth of processing but the pulse laser beam 40 may also be cast on the solid alkali metal 24, thus generating heat and causing the glass tube 22 to melt. Therefore, using the energy of the pulse laser beam 40 of 20 µJ/pulse to 200 µJ/pulse, the penetration hole 21 can be securely formed and the sealing of the ampoule 20 can be broken while avoiding the melting of the glass tube 22.

Next, the pulse width of the pulse laser beam 40 is set on the order of nanoseconds. More specifically, the pulse width of the pulse laser beam 40 is 10 nanoseconds to 50 nanoseconds, and preferably around 30 nanoseconds. A greater pulse width of the pulse laser beam 40 achieves a great amount of processing but tends to cause the influence of heat. A smaller pulse width of the pulse laser beam 40 causes less influence of heat but achieves a smaller amount of processing. If the pulse width is as small as femtoseconds, stability in mass production may fall. Therefore, using the pulse width of the pulse laser beam 40 of 10 nanoseconds to 50 nanoseconds, the penetration hole 21 can be formed in the glass tube 22 in a stable state where the influence of heat is restrained.

The pulse laser beam 40 is cast in such a way as to form a focal point on the top surface of the ampoule 20. If the pulse laser beam 40 is condensed, for example, via a lens with a focal length of 78 mm as the condensing lens 42 shown in FIG. 3C, the spot diameter of the condensed beam is approximately 10 μm. The duration of irradiation with the pulse laser beam 40 is, for example, about 300 msec.

As the penetration hole 21 is thus formed in the ampoule 20 (glass tube 22), the sealing of the ampoule 20 is broken inside the reservoir 16 of the cell section 12. Thus, the solid alkali metal 24 evaporates from inside the ampoule 20 and flows out into the reservoir 16 as the alkali metal gas 13. The alkali metal gas 13 flowing out into the reservoir 16 passes through the communication hole 15 and flows and spreads into the main chamber 14 of the cell section 12. Consequently, the void in the cell section 12 is filled with the alkali metal gas 13, as shown in FIG. 2A.

In the process of forming the penetration hole 21, the penetration hole 21 need not be formed in an orderly shape as long as the sealing of the ampoule 20 is broken, and the solid alkali metal 24 evaporates and flows out from the ampoule 20. Also, a plurality of penetration holes 21 may be formed or a crack may be formed in the glass tube 22 so as to cut the glass tube 22, unless this does not cause the glass tube 22 to melt. Moreover, in addition to causing the solid alkali metal 24 to evaporate and flow out from the ampoule 20, the solid alkali metal 24 may also be released into the void in the cell section 12.

As described above, with the method for manufacturing the gas cell according to the embodiment, the gas cell 10 with excellent capabilities can be produced by processing the ampoule 20 in a stable state, without damaging the cell section 12 and without causing the glass tube 22 of the ampoule 20 to melt. Since the small-sized ampoule 20 with the outer diameter φ of approximately 0.2 mm to 1.2 mm is used, the gas cell 10 with a small size can be produced.

The method for manufacturing the magnetism measurement device according to the embodiment includes the above method for manufacturing the gas cell. Therefore, the magnetism measurement device 100 with a small size and excellent capabilities can be provided. The processes of manufacturing the magnetism measurement device 100 according to the embodiment, other than the process of manufacturing the gas cell 10, can employ a known method and therefore will not be described further.

The embodiment is simply an example of embodying the invention and any modifications and applications are possible within the scope of the invention. As a modification, for example, the following is conceivable.

Modification 1

The device to which the gas cell 10 according to the embodiment is applicable is not limited to the magnetism measurement device 100. The gas cell 10 can also be applied, for example, to an atomic oscillator such as an atomic clock. The gas cell used for an atomic oscillator needs to be small in size. However, since the gas cell 10 with a small size can be produced by the method for manufacturing the gas cell according to the embodiment, the gas cell can be suitably used for the small-sized atomic oscillator.

The entire disclosure of Japanese Patent Application No. 2014-203700, filed Oct. 2, 2014 is expressly incorporated by reference herein.

What is claimed is:

1. A method for manufacturing an atomic oscillator, the method comprising:
   arranging, in a void in a cell section made of a first glass, an ampoule made of a second glass different from the first glass and having a hollow part filled with a material, and then sealing the cell section; and
   casting pulse light on the ampoule through the cell section and thus forming a penetration hole in the ampoule,
   wherein the pulse light has an energy of 20 μJ/pulse to less than 200 μJ/pulse, and
   the first glass has a lower absorption coefficient for the pulse light than an absorption coefficient of the second glass for the pulse light.

2. The method according to claim 1, wherein the pulse light is a laser beam.

3. The method according to claim 1, wherein the pulse light is ultraviolet light.

4. The method according to claim 3, wherein the pulse light has a wavelength range of 248 nm to 355 nm.

5. The method according to claim 1, wherein the pulse light has a pulse width of nanoseconds.

6. The method according to claim 5, wherein the pulse width of pulse light is 10 nanoseconds to 50 nanoseconds.

7. The method according to claim 1, wherein the material is an alkali metal.

8. A method for manufacturing a gas cell, comprising:
   arranging, in a void in a cell section made of a first glass, an ampoule made of a second glass different from the first glass and having a hollow part filled with a material, and then sealing the cell section; and
   casting pulse light on the ampoule through the cell section and thus forming a penetration hole in the ampoule,
   wherein the pulse light has an energy of 20 μJ/pulse to less than 200 μJ/pulse, and
   the first glass has a lower absorption coefficient for the pulse light than an absorption coefficient of the second glass for the pulse light.

9. An atomic oscillator manufactured by the method according to claim 1.

10. The method of claim 1, wherein the second glass is borosilicate glass.

11. The method of claim 8, wherein the second glass is borosilicate glass.

12. A method for manufacturing an atomic oscillator, the method comprising:
    arranging, in a void in a cell section, an ampoule made of borosilicate glass and having a hollow part filled with a material, and then sealing the cell section, the cell section being made from a first glass different from borosilicate glass; and
    casting pulse light on the ampoule through the cell section and thus forming a penetration hole in the ampoule,
    wherein the pulse light has an energy of 20 mJ/pulse to 200 mJ/pulse, and
    the first glass has a lower absorption coefficient for the pulse light than an absorption coefficient of the borosilicate glass for the pulse light.

13. The method according to claim 12, wherein the pulse light is a laser beam.

14. The method according to claim 12, wherein the pulse light is ultraviolet light.

15. The method according to claim 14, wherein the pulse light has a wavelength range of 248 nm to 355 nm.

16. The method according to claim 12, wherein the pulse light has a pulse width of nanoseconds.

17. The method according to claim 16, wherein the pulse width of pulse light is 10 nanoseconds to 50 nanoseconds.

18. The method according to claim 12, wherein the material is an alkali metal.

\* \* \* \* \*